(12) United States Patent
Akiyoshi

(10) Patent No.: US 6,967,882 B1
(45) Date of Patent: Nov. 22, 2005

(54) SEMICONDUCTOR MEMORY INCLUDING STATIC MEMORY

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/043,065

(22) Filed: Jan. 27, 2005

(30) Foreign Application Priority Data

Oct. 15, 2004 (JP) .............................. 2004-300991

(51) Int. Cl.[7] .............................................. G11C 7/00
(52) U.S. Cl. ............. 365/201; 365/189.09; 365/230.06
(58) Field of Search ........................... 365/201, 189.09, 365/230.06

(56) References Cited

U.S. PATENT DOCUMENTS

| 6,683,810 B2 * | 1/2004 | Sakamoto | 365/185.22 |
|---|---|---|---|
| 6,714,477 B2 * | 3/2004 | Nakayama et al. | 365/230.03 |
| 6,731,561 B2 * | 5/2004 | Abe et al. | 365/226 |
| 6,885,608 B2 * | 4/2005 | Nagano | 365/230.05 |

FOREIGN PATENT DOCUMENTS

JP 2000-011688 1/2000

* cited by examiner

Primary Examiner—Anh Phung
Assistant Examiner—Tuan T. Nguyen
(74) Attorney, Agent, or Firm—Arent Fox PLLC

(57) ABSTRACT

A read circuit is connected to bit lines of different cell arrays in common, and determines a logical value of data read out onto any bit line of the cell arrays. An error correcting circuit corrects an error in the data read out onto a common read data line, and outputs the data as corrected data. In order to write back the corrected data into a memory cell from which the corrected data has been originally read out, write switches connect a common write data line through which the corrected data is transmitted, to a corresponding bit line. Thus, during a read cycle the corrected data can be written back to the memory cell.

7 Claims, 8 Drawing Sheets

SEMICONDUCTOR MEMORY INCLUDING STATIC MEMORY

CROSS REFERENCE TO RELATED APPLICATION

This application is based upon and claims the benefit of priority from Japanese Patent Application No. 2004-300991, filed on Oct. 15, 2004, the entire contents of which are incorporated herein by reference.

BACKGROUND OF THE INVENTION

1. Field of the Invention

The present invention relates to a semiconductor memory including static memory cells.

2. Description of the Related Art

With a finer semiconductor device structure and an increase in the storage capacity, increase in a soft error rate due to alpha radiation and neutron radiation is a problem for a semiconductor memory such as a static RAM. Error correction using ECC (Error Correcting Code) is known for a technique to reduce an influence from the soft error. Japanese Unexamined Patent Application Publication No. 2000-11688, for example, discloses a technique in which an error correcting circuit is mounted in a dynamic RAM to write back error corrected data during a read operation and a refresh operation.

In a dynamic RAM, data in a memory cell is destroyed every time the data is read out. Thus, it is necessary to write back the data at every read operation. An actual writeback operation is performed while a bit line is driven to a power supply voltage or a ground voltage (i.e., the voltage of the bit line is sufficiently amplified) by a sense amplifier. On the other hand, in a static RAM data held in a memory cell is not destroyed even after the read operation, unlike in the dynamic RAM. Thus, the static RAM requires no writeback operation during the read operation, and includes no circuits for the writeback operation.

Therefore, in order to add data error correcting function to the static RAM, new circuits, not only an error correcting circuit but also a circuit for writing back error-corrected data to a memory cell, are required. In a conventional static RAM, data read in a read cycle is subjected to error correction in the outside of the static RAM, and thereafter the corrected data is written back in a write cycle.

SUMMARY OF THE INVENTION

It is an object of the present invention to provide a semiconductor memory including static memory cells in which data read out from a memory cell is subjected to error correction during a read cycle to write back the corrected data to the memory cell. Especially, it is an object of the present invention to write back the corrected data to the memory cell in a semiconductor memory having a path for reading data and a path for writing data that are independent of each other.

According to one aspect of a semiconductor memory of the present invention, each cell array includes static memory cells connected to bit lines and word lines. A read circuit is connected to bit lines of different cell arrays in common and determines a logical value of data read out onto any of bit lines of the different cell arrays. An error correcting circuit corrects an error in the data read out onto a common read data line connected to an output of the read circuit, and outputs the data as corrected data. In order to write back the corrected data into a memory cell from which the corrected data has been originally read out, write switches connect a common write data line through which the corrected data is transmitted, to a corresponding bit line. This enables writing back of data whose error has been corrected during a read cycle to a memory cell in a semiconductor memory including independent paths for data read and data write. Especially, it is able to write back the error corrected data during a read cycle to a memory cell in a semiconductor memory having a read data line and a write data line in common to a plurality of cell arrays, i.e., a semiconductor memory having hierarchically arranged bit lines and data lines.

During the read cycle, the first operation control circuit continues to activate a corresponding word line over a period from a read period in which data is read out from the memory cell to a writeback period in which the corrected data is written back to the memory cell. A writeback operation is carried out on the memory cell that has been accessed in a read operation. Thus, it is not necessary to switch the word line to be activated, in accordance with the read period and the writeback period. This eliminates the necessity of a decoding operation for re-activating the word line for the writeback operation, or the like, resulting in reduction in power consumption during the read cycle. Moreover, eliminating the decoding operation for the writeback operation makes it possible to shorten a length of read cycle.

In a preferred example of the semiconductor memory according to one of the aspects of the present invention, a write control circuit outputs the corrected data to the common write data line that is connected to the bit line of the cell array via the write switches, when the error correcting circuit corrects an error in the read data during the read cycle. During a write cycle in which data supplied to an external data terminal is written to the memory cell, the write control circuit outputs write data to be supplied to the external data terminal to the common write data line. Accordingly, the common write data line can be used for transmission of both of normal write data and the corrected data. Therefore, it is able to reduce the number of write data lines, thereby reducing a chip size of the semiconductor memory.

In a preferred example of the semiconductor memory according to one of the aspects of the present invention, a column decoder turns on one of the write switches in accordance with a write address supplied to an external address terminal during the write cycle. The column decoder also turns on one of the write switches in accordance with a read address supplied to the external address terminal when the corrected data is output from the error correcting circuit during the read cycle. On/off controlling the write switches not only during the write cycle but also during the writeback period of the read cycle by use of the column decoder makes it possible to surely write back the corrected data to the memory cell where the error has occurred. Moreover, it is possible to prevent the corrected data from being written to another memory cell.

In a preferred example of the semiconductor memory according to one of the aspects of the present invention, the second operation control circuit outputs a write control signal to the column decoder in response to both of a write request that is supplied via a write request terminal and a writeback control signal the error correcting circuit outputs with the corrected data. The column decoder turns on one of the write switches in accordance with the write control signal. Thus, the second operation control circuit can make the column decoder operate not only during the write cycle but also in the writeback operation during the read cycle.

This allows use of a column decoder of a conventional circuit configuration, thereby shortening a time required for designing a semiconductor memory.

In a preferred example of the semiconductor memory according to one of the aspects of the present invention, the column decoder outputs a write selection signal in accordance with a write address supplied to an external address terminal during the write cycle. Write switch control circuits are provided for the write switches, respectively. The write switch control circuit outputs a write switch signal in response to the write selection signal and to a writeback control signal which the error correcting circuit outputs with the corrected data. Each of the write switches is turned on in response to its corresponding write switch signal. The writeback control signal is not included in logic that makes the column decoder operate. Thus, without operation of the column decoder, the write switch can be turned on directly by the writeback control signal. This can accordingly shorten a length of time required for the writeback operation as well as a length of read cycle.

In a preferred example of the semiconductor memory according to one of the aspects of the present invention, each cell array includes complementary bit lines connected to the memory cells. The read circuit is connected to only one of the complementary bit lines. That is, the present invention is applicable to a semiconductor memory that employs a so-called bit line single-ended system.

In a preferred example of the semiconductor memory according to one aspect of the present invention, a data output circuit outputs the corrected data to an external data terminal when the error correcting circuit outputs the corrected data, and outputs the data read out from the memory cell to the external data terminal when the error correcting circuit outputs no corrected data. This ensures output of the error corrected data to the external terminal during the read cycle.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
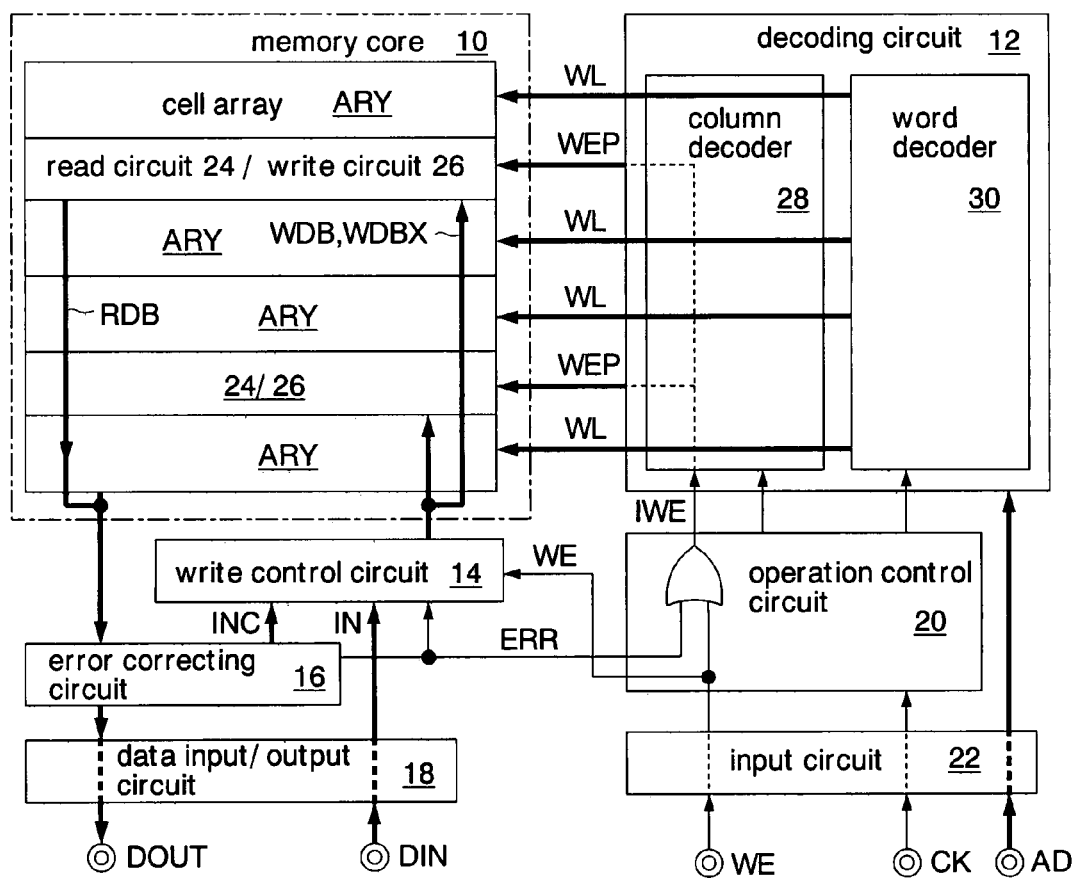
FIG. 1 is a block diagram of a semiconductor memory according to a first embodiment of the present invention.

Embodiments of the present invention will now be described with reference to the drawings. In the drawings, a double circle represents an external terminal; a signal line shown with bold line is formed by a plurality of lines; and a part of a block to which bold line is connected is composed of a plurality of circuits. Moreover, a signal supplied via an external terminal is labeled with the same reference symbol as the name of the external terminal. Furthermore, a signal line through which a signal is transmitted is labeled with the same reference symbol as the name of the signal.

FIG. 1 shows a semiconductor memory according to a first embodiment of the present invention. This semiconductor memory is formed as a static random access memory (hereinafter, referred to as SRAM) on a silicon substrate by using CMOS processes. The SRAM includes a memory core 10, a decoding circuit 12, a write control circuit 14, an error correcting circuit 16, a data input/output circuit 18, an operation control circuit 20 (first and second operation control circuits), and an input circuit 22.

The memory core 10 includes an even number of cell arrays ARY, read circuits 24, and write circuits 26. The cell arrays ARY are arranged on both sides of the read circuit 24 and the write circuit 26. Each read circuit 24 and each write circuit 26 are shared by two cell arrays ARY adjacent to them. The read circuits 24 are connected to the error correcting circuit 16 via a read data bus RDB (common read data line). The write circuits 26 are connected to the write control circuit 14 via write data buses WDB and WDBX (common write data line). The details of the memory core 10 are described later with reference to FIG. 2.

The decoding circuit 12 includes a column decoder 28 and a word decoder 30. During a write cycle, the column decoder 28 decodes an address signal AD (lower-order bits of a write address) supplied via an external address terminal AD and the input circuit 22, and changes a write pulse signal WEP corresponding to the address signal AD to a high level in synchronization with an internal write enable signal IWE (write control signal) from the operation control circuit 20. During a read cycle, the column decoder 28 decodes an address signal AD (lower-order bits of a read address) in synchronization with the internal write enable signal IWE that responds to a write-back control signal ERR, and changes a write pulse signal WEP corresponding to the address signal AD to a high level. During the read cycle and the write cycle, the word decoder 30 decodes an address signal AD (higher-order bits of a read address and a write address) in synchronization with a timing signal from the operation control circuit 20, and activates a word line WL corresponding to the address signal AD to a high level.

During the read cycle the write control circuit 14 outputs corrected data INC output from the error correcting circuit 16, to the write data buses WDB and WDBX in synchronization with the write-back control signal ERR of a high level. Through the write data buses WDB and WDBX, complementary data signals are transmitted. During the write cycle, the write control circuit 14 outputs write data DIN supplied via the data input/output circuit 18 to the write data buses WDB and WDBX in synchronization with the internal write enable signal IWE. The details of the write control circuit 14 will be described later with reference to FIG. 3.

During the read cycle, the error correcting circuit 16 determines whether or not data (formed of a plurality of bits) read from a cell array ARY onto the read data bus RDB includes any error, and generates corrected data INC in the case where the read data includes error. Error correction is performed by using a parity bit, for example. More specifically, the cell array ARY has an information region into which write data DIN of a plurality of bits is written and a parity region into which a parity bit of the write data DIN is written. The corrected data INC is output to the write control circuit 14 and the data input/output circuit 18. In the case where the read data has no error, the error correcting circuit 16 outputs the read data to the data input/output circuit 18. When detecting an error, the error correcting circuit 16 outputs a write-back control signal ERR together with the corrected data INC.

During the read cycle, the data input/output circuit 18 outputs the read data or corrected data INC that is output from the error correcting circuit 16, to an external data terminal DOUT. That is, the data input/output circuit 18 operates as a data output circuit. During the write cycle, the data input/output circuit 18 receives write data via an external data terminal DIN and outputs the received data as write data IN to the write control circuit 14. That is, the data input/output circuit 18 operates as a data input circuit. The external data terminals DOUT and DIN are composed of 16 bits, for example. In the present embodiment, the external data terminal DOUT for reading and the external data terminal DIN for writing are provided independently of each other. Alternatively, a common external data terminal for reading and writing may be provided.

The operation control circuit 20 operates in synchronization with a clock CK supplied to an external clock terminal CK, and generates timing signals for controlling a read operation and a write operation of the SRAM, and the like. For example, the operation control circuit 20 generates a word line activating timing signal that sets an activation period of a word line WL. The operation control circuit 20 includes an OR circuit that outputs a write enable signal WE or a write-back control signal ERR as an internal write enable signal IWE.

The input circuit 22 receives the write enable signal WE, the clock CK, and an address AD that are supplied via external terminals, respectively, and outputs the received signals to the operation control circuit 20 and the decoding circuit 12. The SRAM recognizes a read cycle when the write enable signal WE is at a low level, while recognizing a write cycle when the write enable signal WE is at a high level.

Figure 2:
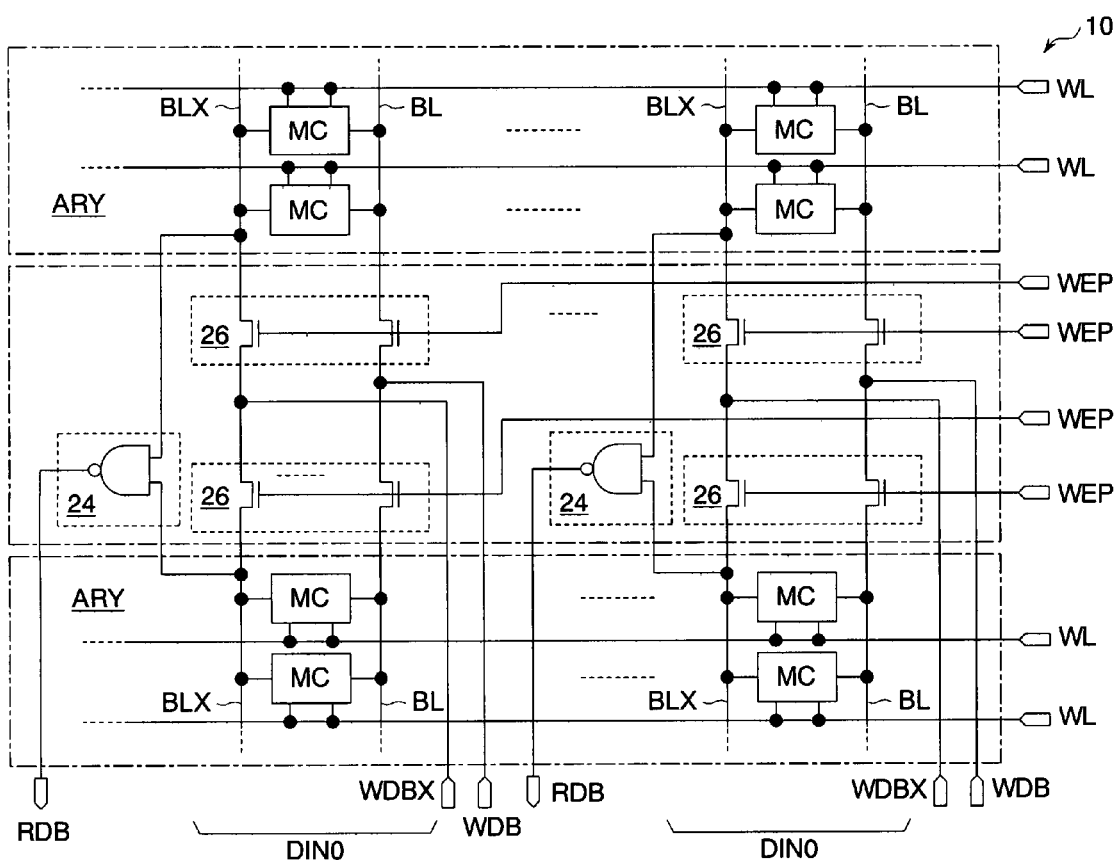
FIG. 2 is a circuit diagram showing details of a memory array shown in FIG. 1.

FIG. 2 shows the details of the memory core shown in FIG. 1. The cell array ARY includes a plurality of static memory cells MC that are arranged in a matrix and are connected to complementary bit lines BL and BLX and word lines WL. In the present embodiment, the length of the bit lines BL and BLX is shorter than that of the word line WL. Thus, load capacitance and wiring resistance of the bit lines BL and BLX are small. The details of the memory cell MC will be described later with reference to FIG. 3. In the SRAM of the present embodiment, a path for reading data from a cell array ARY (read data bus RDB) and a path for writing data into the cell array ARY (write data buses WDB and WDBX) are independent of each other.

The read circuit 24 includes a two-input NAND gate (OR circuit of negative logic) which has inputs connected to the bit lines BLX of the adjacent cell arrays ARY, respectively, and an output connected to the read data bus RDB. The NAND gate operates as an amplifier that amplifies the magnitude of a signal of data read onto the bit line BLX and determines logic of the data. The read circuit 24 is provided for each pair of complementary bit lines BL and BLX. The read circuit 24 is connected to the bit line BLX only, and not connected to the bit line BL. A system for reading data by using only one of the complementary bit lines BL and BLX is generally called as a single-ended system. That is, the present invention is applicable to an SRAM that employs a so-called bit line single-ended system. Moreover, in the present embodiment, a path for transmitting data read from a memory cell MC is hierarchized into the bit lines BL and BLX and the read data bus RDB.

The write circuit 26 includes a pair of nMOS transistors (write switch) for connecting the write data buses WDB and WDBX to the bit line pair BL and BLX, respectively. The write circuit 26 is provided for each cell array ARY to correspond to each bit line pair BL and BLX. The gates of the nMOS transistor pair are on while receiving the write pulse signal WEP of a high level. In this example, the bit line pair BL and BLX are assigned to data DIN0 (I/O number=0) and have different addresses. Thus, for each cell array ARY, a write pulse signal WEP that is different from those for the other cell arrays ARY is supplied to the write circuit 26. Incidentally, the write circuits 26 corresponding to the bit line pair BL and BLX that have the same address but are assigned to different I/O numbers operate simultaneously when receiving the write pulse signal WEP that is common to the write circuits 26, although the write circuits 26 are not shown.

Figure 3:
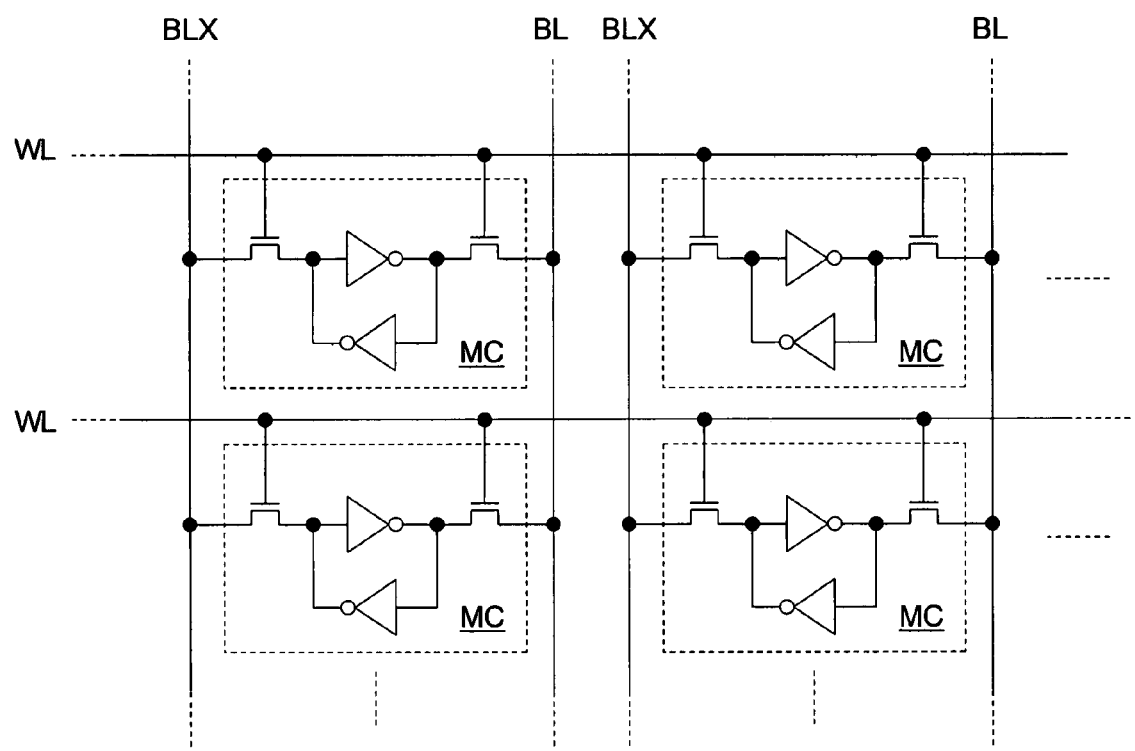
FIG. 3 is a circuit diagram showing details of a memory cell shown in FIG. 2.

FIG. 3 shows the details of the memory cell shown in FIG. 2. Each memory cell MC includes a latch that is formed by a pair of inverters and holds write data, and a pair of transfer transistors (nMOS transistors). The transfer transistors have ends connected to complementary storage nodes of the latch (output nodes of the inverters), respectively. The other end of the transfer transistor is connected to one of complementary bit lines BL and BLX. The gate of the transfer transistor is connected to a word line WL.

Figure 4:
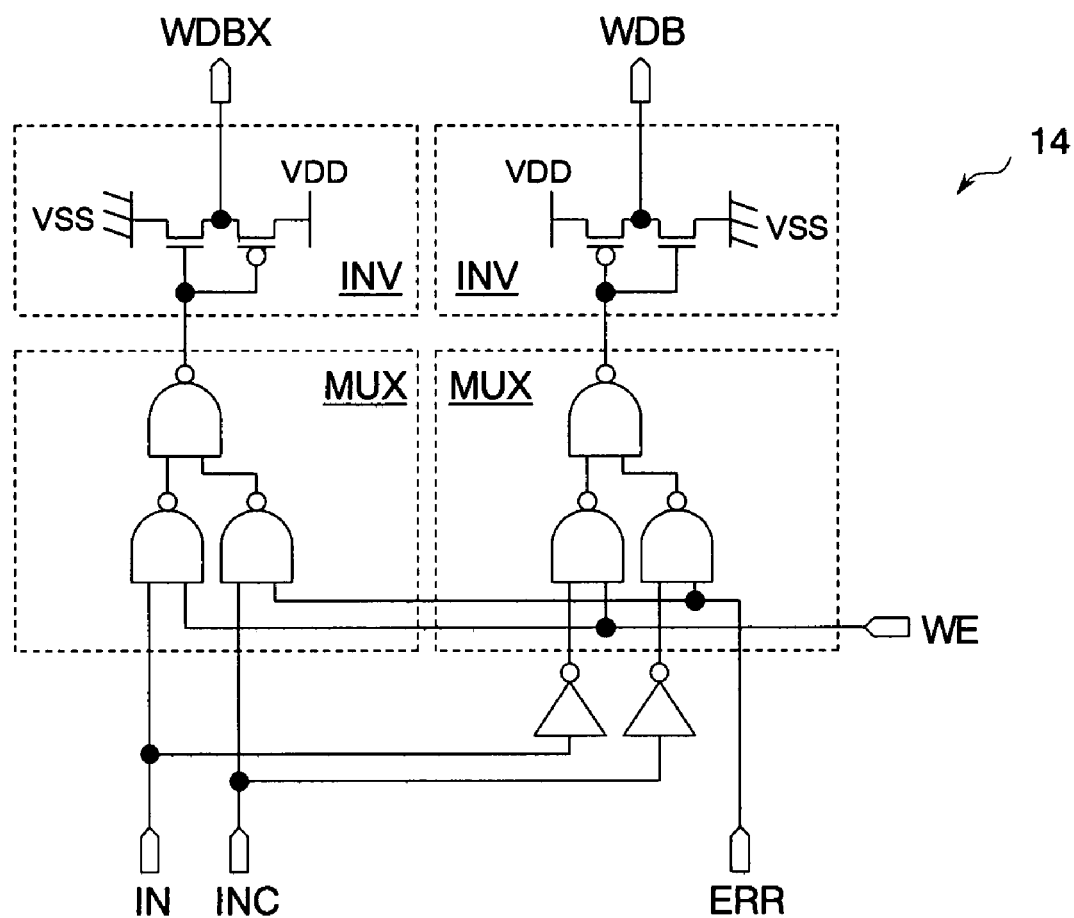
FIG. 4 is a circuit diagram showing details of a write control circuit shown in FIG. 1.

FIG. 4 shows the details of the write control circuit shown in FIG. 1. The write control circuit 14 includes a multiplexer MUX composed of three NAND gates and a CMOS inverter INV connected to an output of the multiplexer MUX. The multiplexer MUX and the inverter INV are provided to correspond to each of the write data buses WDB and WDBX. The multiplexer MUX selects write data IN (or its inverted signal) during a period in which it receives a write enable signal WE of a high level, and selects corrected data INC (or its inverted signal) during a period in which it receives a write-back control signal ERR of a high level, i.e., when the error correcting circuit 16 has corrected an error in read data. The selected data is output to the write data bus WDB or WDBX via the inverter INV, and is then written into a memory cell MC. In other words, the write data buses WDB and WDBX are used both for transmitting the write data IN in a normal write cycle and for transmitting the corrected data INC.

Figure 5:
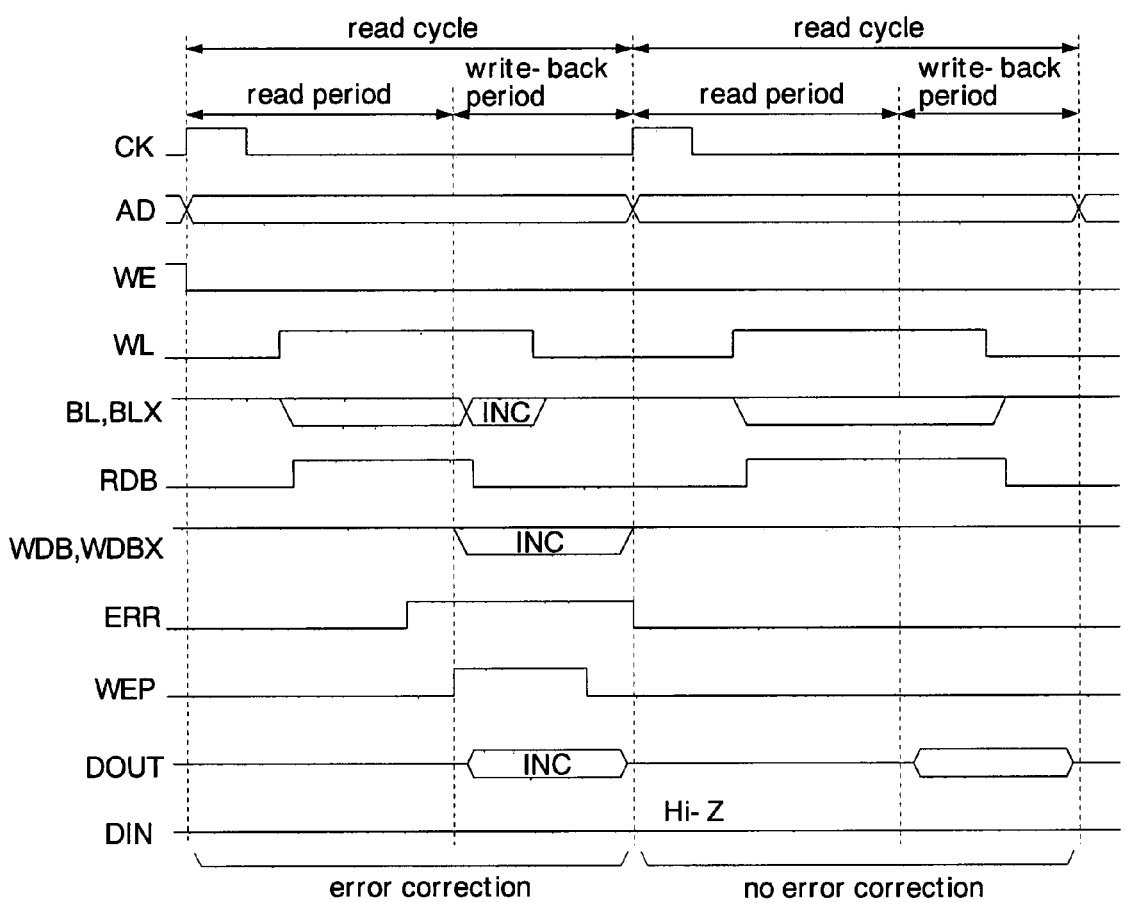
FIG. 5 is a timing chart of a read operation of the semiconductor memory of the first embodiment.

FIG. 5 shows the read cycle of the SRAM of the first embodiment. The read cycle starts when the operation control circuit 20 has received a write enable signal WE of a low level in synchronization with a rising edge of the clock CK. The read cycle is composed of a read period in which data is read out from a memory cell MC and a write-back period in which error correction is made on the read data and corrected data is written back to the memory cell MC. The word line WL continues to be activated from the read period until the write-back period by the word line activating timing signal output from the operation control circuit 20. Since re-decoding by the word decoder 30 is made unnecessary, power consumption of the SRAM can be reduced and a time required for the read cycle can be shortened.

During the read period, in order to select the memory cell MC to access, a word line WL is activated in accordance with an address AD, so that data is output from the memory cell MC to a bit line BL (or BLX). Note that the bit lines BL and BLX are pre-charged to a high level in advance. In the SRAM of the present invention, the length of the bit lines BL and BLX is short and therefore the load capacitance thereof is small. Thus, a voltage of the bit line BL (or BLX) can be changed to a ground voltage in a short time by drivability of the inverter forming the latch of the memory cell MC. That is, during the read cycle, the voltages of the bit lines BL and BLX are sufficiently amplified. The error correcting circuit 16 starts its operation in a latter half of the read period, and, in the case where the read data includes any error, outputs corrected data INC and a write-back control signal ERR.

During the write-back period, the corrected data INC is output to the write data buses WDB and WDBX in response to the change in the write-back control signal ERR to a high level. In addition, the column decoder 28 outputs a write pulse signal WEP corresponding to the read address AD in response to the change in the internal write enable signal IWE to a high level caused by the change in the write-back control signal ERR to a high level. That is, the column decoder 28 operates not only during the write cycle but also during the read cycle. When the nMOS transistor pair of the corresponding write circuit 26 turn on in response to the write pulse signal WEP, the corrected data INC is transmitted to the bit lines BL and BLX and is written back to the memory cell MC. The data input/output circuit 18 outputs the corrected data INC as read data to the external data terminal DOUT. Writing back the corrected data INC only to the memory cell MC (16 bits for each I/O) having an error can reduce the increase in the power consumption caused by the write-back operation to a minimum.

On the other hand, in the case where the read data includes no error, the error correcting circuit 16 does not output the write-back control signal ERR. Therefore, no write pulse signal WEP is output, and the write-back operation is not carried out. In this case, the data input/output circuit 18 outputs the data read out from the memory cell MC to the external data terminal DOUT.

Figure 6:
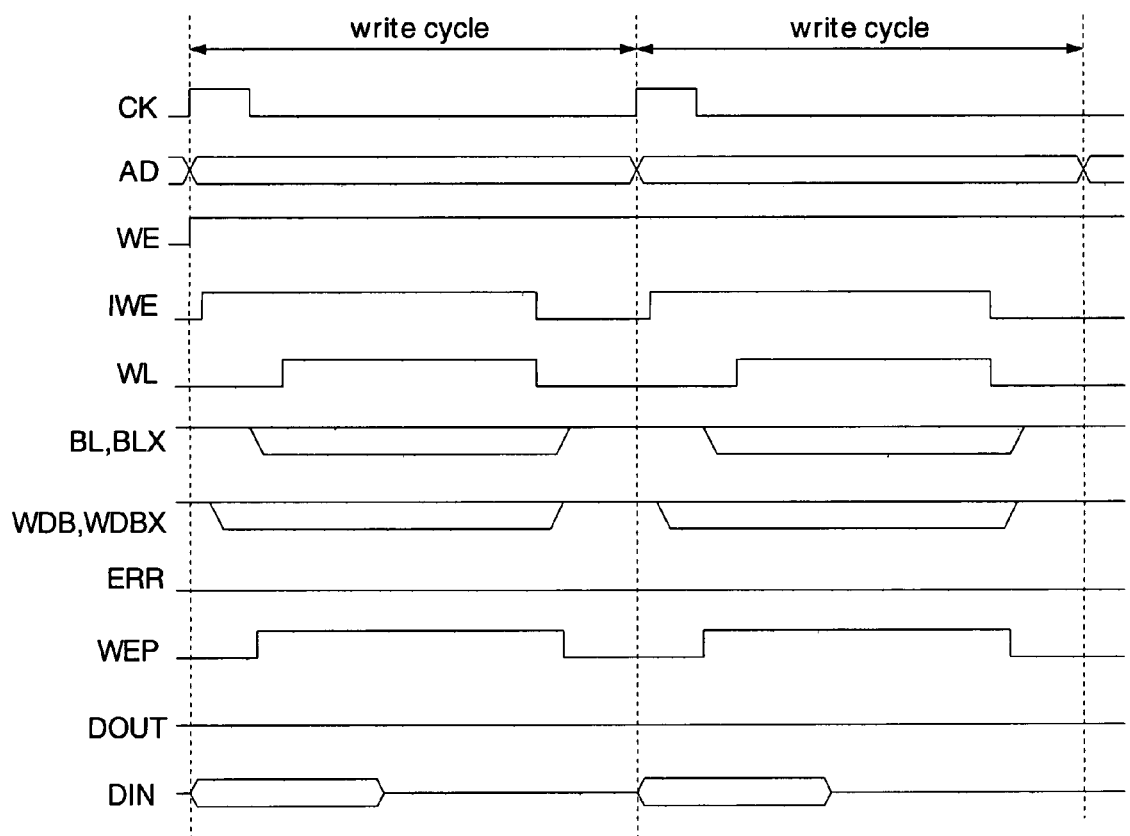
FIG. 6 is a timing chart of a write operation of the semiconductor memory of the first embodiment.

FIG. 6 shows a write cycle of the SRAM of the first embodiment. The write cycle starts when the operation control circuit 20 has received the write enable signal WE of a high level (write request) supplied to the write enable terminal (write request terminal) WE in synchronization with a rising edge of the clock CK.

During the write cycle, an address AD (write address) is supplied to the external address terminal AD in synchronization with the clock CK, and write data is supplied to the external data terminal DIN. The write data is supplied to the write data buses WDB and WDBX in synchronization with the internal write enable signal IWE. The column decoder 28 activates one of the write pulse signals WEP in accordance with the address AD, thereby turning on the nMOS transistor pairs in the corresponding write circuit 26. By turning on the nMOS transistor pairs, the write data on the write data buses WDB and WDBX is transmitted to the bit lines BL and BLX. Then, in order to write the write data into the memory cell MC, the word decoder 30 activates a word line WL in accordance with the address AD.

As described above, according to the first embodiment of the present invention, in the SRAM having the read data bus RDB and the write data buses WDB and WDBX, data for which an error has been corrected can be written back to a memory cell MC during the read cycle. Moreover, in the SRAM in which the bit lines BL and BLX and the read data bus RDB are hierarchized, the error corrected data can be written back to the memory cell MC during the read cycle.

By continuing to activate a word line from the read period until the write-back period without switching the word line during the read cycle, the re-decoding operation of the word decoder 30, and the like, can be made unnecessary. Thus, the power consumption during the read cycle can be reduced. In addition, since the re-decoding operation of the word decoder 30 is not needed for the write-back operation, so that a length of the read cycle can be shortened.

The write control circuit 14 (FIG. 4) makes it possible to use the write data buses WDB and WDBX for transmitting both of write data IN during a normal write cycle and the corrected data INC. This can reduce the number of the write data buses WDB and WDBX provided in the cell array ARY, thus reducing a chip size of the SRAM.

When the error correcting circuit 16 corrects an error in read data, nMOS transistor pairs (write switch) of the corresponding write circuit 26 can be turned on by a decoding operation of the column decoder 28. In other words, the column decoder 28 turns on any of nMOS transistor pairs in response to the internal write enable signal IWE. By using the column decoder 28 not only for the write cycle but also for the write-back operation in the read cycle, the corrected data INC can be surely written back to the memory cell in which an error has occurred. Moreover, it is possible to prevent the corrected data INC from being written into another memory cell in which no error has occurred. By making the column decoder 28 operate in response to the internal write enable signal IWE generated by the operation control circuit 20, a column decoder having the same configuration as that of the conventional column decoder can be used. Thus, a period required for designing an SRAM can be shortened.

The data input/output circuit 18 receives the corrected data INC or read data for which no correction has been done, from the error correcting circuit 16. Thus, the data input/output circuit 18 can have the same configuration as that of the conventional circuit and can surely output the data INC for which error correction has been done to the external data terminal DOUT during the read cycle.

Figure 7:
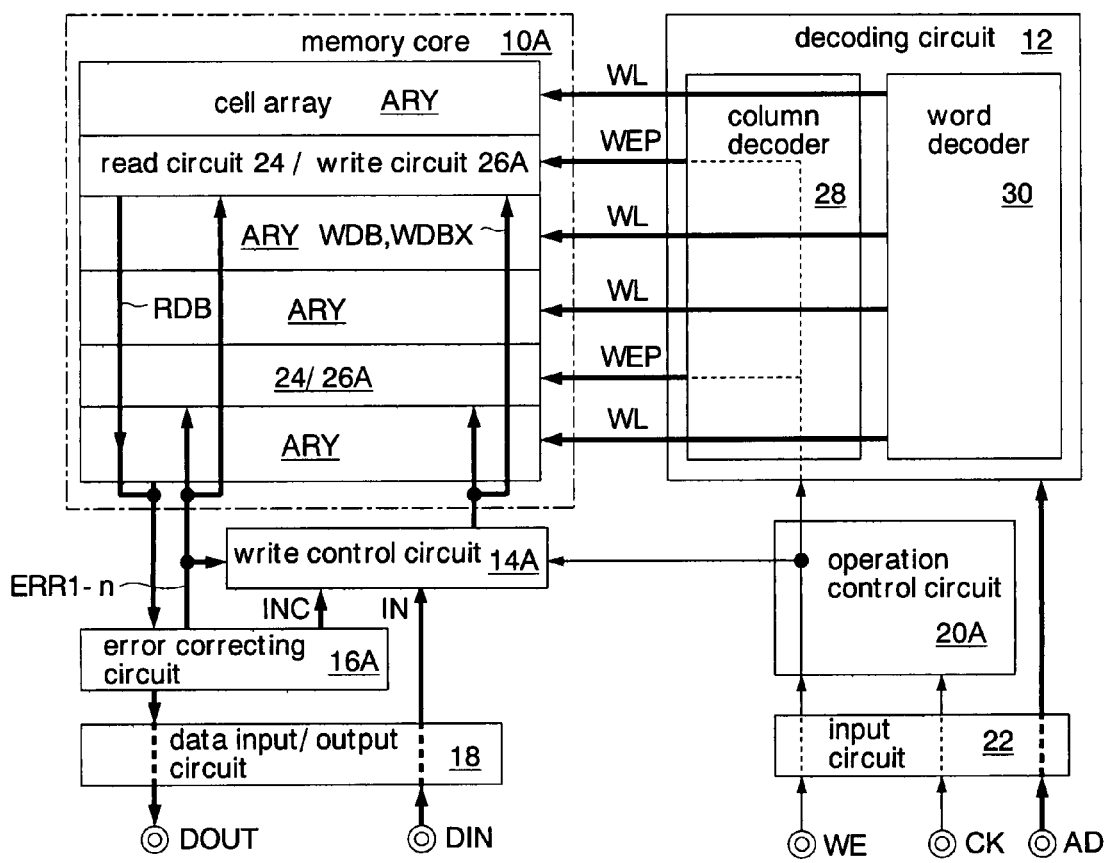
FIG. 7 is a block diagram of a semiconductor memory according to a second embodiment of the present invention.

FIG. 7 shows a semiconductor memory according to a second embodiment of the present invention. The same components as those described in the first embodiment are labeled with the same reference symbols and the detailed description thereof is omitted. In the SRAM of the present embodiment, the write control circuit 14, the error correcting circuit 16, the operation control circuit 20, and the write circuit 26 of the first embodiment are replaced with a write control circuit 14A, an error correcting circuit 16A, an operation control circuit 20A, and a write circuit 26A, respectively. Except for the above, the SRAM of the present embodiment has the same configuration as that of the first embodiment. That is, this semiconductor memory is formed as an SRAM on a silicon substrate by using CMOS processes.

The error correcting circuit 16A generates corrected data INC and write-back control signals ERR1 to ERRn respectively corresponding to pairs of write data buses WDB and WDBX, where "n" is a number obtained by dividing the number of pairs of bit lines BL and BLX in a cell array ARY by the number of I/Os. The error correcting circuit 16A only changes to a high level a write-back control signal ERR (any of ERR1 to ERRn) that corresponds to a memory cell MC in which an error has occurred. The write control circuit 14A includes the circuit shown in FIG. 4 for each of the write-back control signals ERR1 to ERRn. Thus, the write control circuit 14A outputs the corrected data and its inverted data only to the data buses WDB and WDBX that correspond to the write-back control signal ERR of a high level (any of ERR1 to ERRn). The other write data buses WDB and WDBX are kept in a floating state because CMOS inverters INV are turned off.

The operation control circuit 20A includes no logical circuit for generating an internal write enable signal IWE from a write enable signal WE and the write-back control signal ERR. The operation control circuit 20A outputs the write enable signal WE received at an external terminal directly to the write control circuit 14 and the column decoder 28. The write circuit 26A operates when receiving the write pulse signal WEP and the write-back control signal ERR. The details of the write circuit 26A will be described later with reference to FIG. 8.

Figure 8:
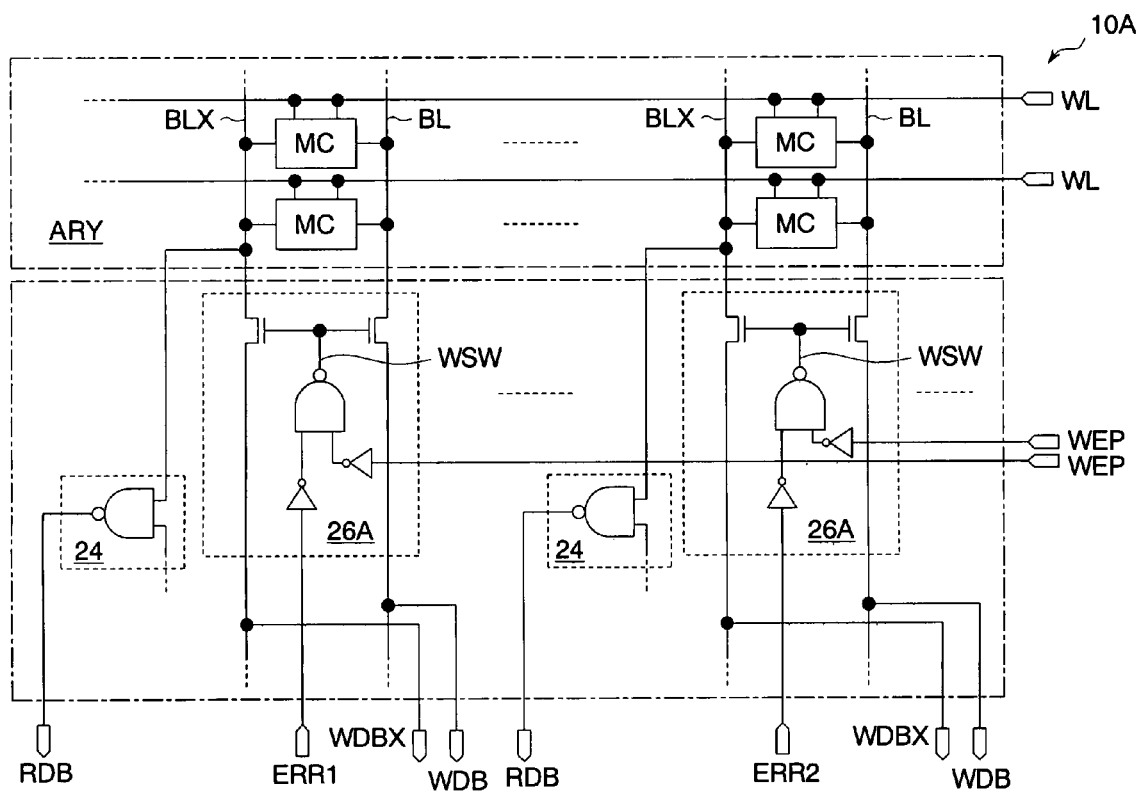
FIG. 8 is a circuit diagram showing details of a memory array shown in FIG. 7.

FIG. 8 shows the details of the memory array shown in FIG. 7. The cell array ARY and the read circuit 24 are the same as those in the first embodiment. The write circuit 26A is different from the write circuit in the first embodiment in logic for controlling an operation of pairs of nMOS transistors that connect the write data buses WDB and WDBX to the bit lines BL and BLX, respectively. In other words, the gates of the nMOS transistor pairs receive a write switch signal WSW output from a NAND gate (write switch control circuit). The NAND gate receives an inverted signal of a corresponding one of the write-back control signals ERR1 to ERRn from the error correcting circuit 16A and an inverted signal of the write pulse signal WEP (write selection signal) from the column decoder 28. Thus, the nMOS transistor pairs are turned on during a period in which they receive the corresponding write-back control signal ERR1 to ERRn of a high level or the write pulse signal WEP of a high level.

In the present embodiment, in the case where data read out from a memory cell MC during a read cycle includes any error, the error correcting circuit 16A generates corrected data INC and a write-back control signal ERR (for example, ERR0) corresponding to the corrected data INC. Thus, only nMOS transistor pair in the write circuit 26A corresponding to the write-back control signal ERR0 are turned on. The write control circuit 14A that has been turned on outputs the corrected data INC and its inverted data to the write data buses WDB and WDBX. Then, the corrected data INC is written back into only the memory cell MC where the error has occurred.

On the other hand, nMOS transistor pairs of the write control circuits 14A that receive write-back control signals ERR1 to ERRn of a low level are not turned on. Thus, the write data buses WDB and WDBX that do not correspond to the memory cell MC where the error has occurred are kept in a floating state. Therefore, the data cannot be erroneously written into a memory cell MC other than that in which the error has occurred.

As described above, in the second embodiment, the same effects as those in the first embodiment can be also achieved. Moreover, in the second embodiment, the write-back control signal ERR is supplied directly to the write circuit 26A without going through the column decoder 28, thereby nMOS transistor pairs are directly turned on. Thus, a time required for the write-back operation can be shortened.

The invention is not limited to the above embodiments and various modifications may be made without departing from the spirit and scope of the invention. Any improvement may be made in part or all of the components.

What is claimed is:

1. A semiconductor memory comprising:
    a plurality of cell arrays each having static memory cells;
    bit lines and word lines wired on said cell arrays, respectively, and connected to said static memory cells;
    a read circuit connected in common to the bit lines of different ones of said cell arrays, and determining a logical value of data read out onto any of the bit lines of said cell arrays;
    a common read data line connected to an output of said read circuit;
    an error correcting circuit connected to said common read data line, correcting an error in the data read out onto said common read data line and outputting the data as corrected data;
    a common write data line for transmitting the corrected data therethrough;
    write switches connecting said common write data line to a corresponding bit line in order to write back the corrected data to one of said memory cells from which the corrected data has been originally read out; and
    a first operation control circuit continuing to activate a corresponding word line during a read cycle over a period from a read period in which the data is read out from the one of said memory cells to a writeback period in which the corrected data is written back to the one of said memory cells.

2. The semiconductor memory according to claim 1, further comprising:
    an external data terminal receiving write data to be written to said memory cells; and
    a write control circuit outputting the corrected data to said common write data line when said error correcting circuit corrects an error in read data during the read cycle, and outputting the write data supplied to said external data terminal to said common write data line during a write cycle in which data to be supplied to said external data terminal is written to said memory cells.

3. The semiconductor memory according to claim 2, further comprising:
    an external address terminal receiving an address for selecting a memory cell to access; and
    a column decoder turning on one of said write switches in accordance with a write address supplied to said external address terminal during the write cycle, and turning on one of said write switches in accordance with a read address supplied to said external address terminal when the corrected data is outputted from said error correcting circuit during the read cycle.

4. The semiconductor memory according to claim 3, further comprising:
    a write request terminal receiving a write request indicating a request for the write cycle; and
    a second operation control circuit outputting a write control signal to said column decoder in response to the write request and a write-back control signal which is outputted with the corrected data from said error correcting circuit, wherein
    said column decoder turns on one of said write switches in response to the write control signal.

5. The semiconductor memory according to claim 2, further comprising:
    an external address terminal receiving an address for selecting a memory cell to access;
    a column decoder outputting a write selection signal in accordance with a write address supplied to said external address terminal during the write cycle; and
    write switch control circuits provided for said write switches, respectively, outputting a write switch signal in response to the write selection signal and a writeback control signal which is outputted with the corrected data from said error correcting circuit, wherein each of said write switches turns on in response to a corresponding write switch signal.

6. The semiconductor memory according to claim 1, wherein:

each of said cell arrays includes complementary bit lines connected to said memory cells; and said read circuit is connected to only one of said complementary bit lines.

7. The semiconductor memory according to claim 1, further comprising a data output circuit outputting the corrected data to an external data terminal when said error correcting circuit outputs the corrected data, and outputting data read out from the one of said memory cells to said external data terminal when said error correcting circuit outputs no corrected data.

\* \* \* \* \*